(12) United States Patent
Karklin et al.

(10) Patent No.: US 7,791,361 B2
(45) Date of Patent: Sep. 7, 2010

(54) PLANARIZING PROBE CARD

(75) Inventors: Ken Karklin, Pasadena, CA (US); Raffi Garaedian, Monrovia, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 0 days.

(21) Appl. No.: 11/953,204

(22) Filed: Dec. 10, 2007

(65) Prior Publication Data

US 2009/0146675 A1   Jun. 11, 2009

(51) Int. Cl.
*G01R 31/02* (2006.01)

(52) U.S. Cl. .................................................. 324/758

(58) Field of Classification Search ......... 324/754–765, 324/158.1; 439/482
See application file for complete search history.

(56) References Cited

U.S. PATENT DOCUMENTS

| | | | |
|---|---|---|---|
| 3,611,128 A | 10/1971 | Nagata | |
| 3,806,801 A | 4/1974 | Bove | |
| 4,038,599 A | 7/1977 | Bove et al. | |
| 4,063,172 A | 12/1977 | Faure et al. | |
| 4,636,722 A | 1/1987 | Ardezzone | |
| 4,751,457 A | 6/1988 | Veenendaal | |
| 4,837,622 A | 6/1989 | Whann et al. | |
| 4,906,920 A | 3/1990 | Huff et al. | |
| 4,965,865 A | 10/1990 | Trenary | |
| 4,975,638 A | 12/1990 | Evans et al. | |
| 5,089,772 A | 2/1992 | Hatada et al. | |
| 5,091,694 A | 2/1992 | Ikeda et al. | |
| 5,191,708 A | 3/1993 | Kasukabe et al. | |
| 5,321,453 A | 6/1994 | Mori et al. | |
| 5,436,568 A | 7/1995 | Woith | |
| 5,521,518 A | 5/1996 | Higgins | |
| 5,621,333 A | 4/1997 | Long et al. | |
| 5,623,213 A | 4/1997 | Liu et al. | |
| 5,635,846 A | 6/1997 | Beaman et al. | |

(Continued)

FOREIGN PATENT DOCUMENTS

EP   1785733 A   5/2007

(Continued)

OTHER PUBLICATIONS

Sep. 10, 2008 International Search Report.

(Continued)

*Primary Examiner*—Ha Tran T Nguyen
*Assistant Examiner*—Arleen M Vazquez
(74) *Attorney, Agent, or Firm*—Manuel F. de la Cerra (57) ABSTRACT

A novel planarizing probe card for testing a semiconductor device is presented. The probe card is adapted to come into contact with a probe card mount that is in adjustable contact with the prober. The probe card includes a printed circuit board affixed to a stiffener and a probe head that is in electrical contact with the printed circuit board. The probe head also includes a plurality of probe contactor tips that define a first plane. The stiffener further contains at least two planarizing adjusters that comes into contact with the probe card mount. The adjusters may be actuated to alter the position of first plane. A surface of the semiconductor device under test may define a second plane, and the adjusters may be adjusted to position the first plane to be substantially parallel to the second plane.

10 Claims, 11 Drawing Sheets

U.S. PATENT DOCUMENTS

| | | | |
|---|---|---|---|
| 5,642,056 A * | 6/1997 | Nakajima et al. | 324/758 |
| 5,804,983 A | 9/1998 | Nakajima et al. | |
| 5,828,226 A | 10/1998 | Higgins et al. | |
| 5,923,178 A | 7/1999 | Higgins et al. | |
| 5,939,893 A | 8/1999 | Elsner et al. | |
| 5,974,662 A | 11/1999 | Eldridge et al. | |
| 6,078,186 A | 6/2000 | Hembree et al. | |
| 6,305,230 B1 * | 10/2001 | Kasukabe et al. | 73/855 |
| 6,420,887 B1 | 7/2002 | Kister et al. | |
| 6,455,335 B1 | 9/2002 | Kohno et al. | |
| 6,501,289 B1 | 12/2002 | Takekoshi | |
| 6,677,771 B2 | 1/2004 | Zhou et al. | |
| 6,762,612 B2 | 7/2004 | Yu et al. | |
| 6,794,889 B2 * | 9/2004 | Jafari et al. | 324/758 |
| 7,084,651 B2 * | 8/2006 | Audette et al. | 324/754 |
| 7,096,935 B2 | 8/2006 | Ieda et al. | |
| 7,119,566 B2 * | 10/2006 | Kim | 324/758 |
| 7,262,611 B2 * | 8/2007 | Mathieu et al. | 324/754 |
| 2002/0024354 A1 | 2/2002 | Pietzschmann | |
| 2002/0057099 A1 * | 5/2002 | Esashi et al. | 324/761 |
| 2003/0080763 A1 * | 5/2003 | Yu et al. | 324/758 |
| 2003/0201764 A1 * | 10/2003 | Jafari et al. | 324/158.1 |
| 2008/0036480 A1 * | 2/2008 | Hobbs et al. | 324/754 |

FOREIGN PATENT DOCUMENTS

| | | |
|---|---|---|
| JP | 63244640 A | 12/1988 |
| JP | 01176946 A | 7/1989 |

OTHER PUBLICATIONS

Karl F Zimmermann, SiProbe—A New Technology for Wafer Probing, International Test Conference, 1995, paper 4.3 (Attached as NPL Document).

* cited by examiner

PLANARIZING PROBE CARD

1. FIELD OF THE INVENTION

The present invention relates to devices for testing semiconductor devices and more particularly to the planarization of probe cards used in such testing.

2. BACKGROUND OF THE INVENTION

A modern probe card used to test wafers of semiconductor chips generally consists of a Printed Circuit Board (PCB) (also referred to as a printed wiring board or probe card wiring board), a probe contactor substrate having probes for contacting the wafer (sometimes referred as a probe head), and an interposer connecting the PCB to the probe contactor substrate.

Probes (also referred to as probe contactors) are generally compliant mechanisms including at least one spring which have some limited range of compliance in a vertical direction (the "z" direction). When in use, a wafer under test is urged upward to contact the tips of the probes. In practice, there is some manufacturing process-related z error (non-planarity of the probe tips) caused by film stresses, etch control, assembly control, etc. as well as systemic z errors caused by a warping or curving in the surface of the probe contactor substrate. If the probe contactor substrate is curved or warped, so will be the imaginary plane defined by the tips (assuming that the probes are of uniform height). Thus some probe tips will contact the wafer first (called the first touch z height) and some probe tips will contact the wafer last (last touch z height). Because probes generally have a limited range of compliance (as small as 50 µm or less for many microfabricated technologies), it is desirable to minimize both the process-related and systemic errors in tip z height. Some errors are most directly related to the fabrication of the probes on the probe contactor substrate rather than the probe card design. And some errors are directly related to the probe card and the way the PCB is mounted with the probe contactor substrate or substrates.

Figure 7A:
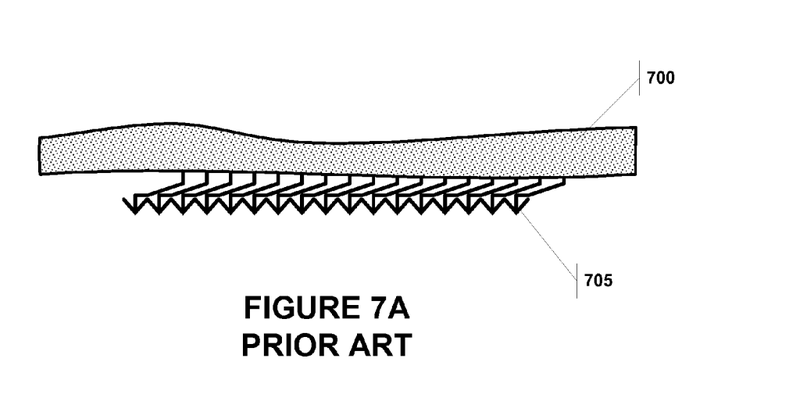
FIG. 7A illustrates a probe head as is known in the art.
Figure 7B:
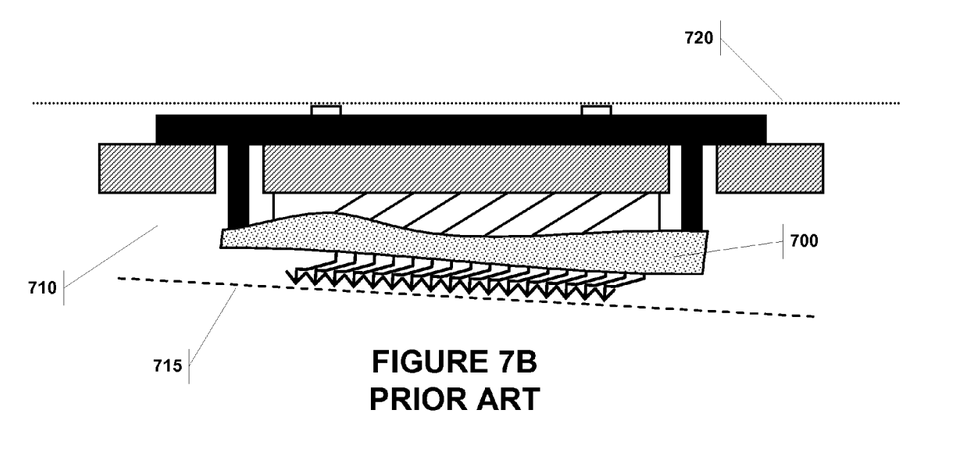
FIG. 7B illustrate a probe card as is known in the art.

Referring to FIG. 7A, a common problem with mounting the probe head to the probe card, is that the probe contactor substrate 700 to which the probe contactors 705 are attached is generally non-uniform and has thickness variations across its surface. (While not shown in FIG. 7A, the probe contactor substrate may also have variations in the in the thickness in the direction orthogonal to the plane of the page.) The probe contactor substrate 700 is generally mounted to the probe card 710 in such a manner that the planarity is set by the location of discrete points along the back surface (the surface opposite of the probe contactors) of the probe contactor substrate 700 as shown in FIG. 7B; thus, due to the non-uniform thickness of the probe contactor substrate 700, the plane 715 of the probe contactor tips may not be co-planar with the plane 720 of the reference plane. The probe contactor may also be mounted to the probe card in such a manner that the planarity is set by the location of discrete points along the front surface of the probe contactor substrate. In this case, tolerances in the probe card as well as other non-planarities can cause the plane of the probe contactor tips to be non-co-planar to the reference plane. It is a further problem that because of manufacturing tolerances or errors, the overall heights of the probe contactors can vary linearly across the substrate such that when referenced to the reference plane (i.e., 720), the probe tips lie in a plane that is tilted.

In older probe card applications, a prober has a surface which has been planarized to that of the chuck that carries the wafer under test. The probe card PCB is generally mounted to this planarized surface of the prober. Thus, all such probe card assemblies require well controlled parallelism between the plane of the probe tips (the best-fit plane that minimizes the overall root-mean-square z error between the probe tips and the plane) and the plane of the PCB (the PCB can be thought of as the "reference plane." If the probe tips are co-planar with the PCB, then they are also co-planar with the chuck, and thus with the wafer under test). Such a design will lead to a more uniform contact of the probes to the wafer under test (less of a distance between first touch z distance and last touch z distance). However, this older type of mounting is unable to support the high probing forces or probing tolerances required in modern high precision and high pincount probing applications. In newer probe cards, the probe tips are referenced to mounting points on the probe card which are typically kinematic mounts of some type (used here to describe a mount that provides accurate and repeatable mechanical docking of the probe card into the test equipment and provides constraint in at least the three degrees of freedom necessary to achieve parallelism to the plane of the wafer chuck). In either embodiment, it is necessary to align the tips of the probe contactors such that they are parallel to a reference plane which is itself parallel to the plane of the wafer chuck.

There are two common ways that a probe contactor substrate may be mounted to the probe card (which includes the PCB, an associated stiffener ring and/or other mechanical elements) in a planar manner: Fixed Probe Card Assemblies (FPCAs) and Adjustable Probe Card Assemblies (APCAs). FPCAs provide for design simplicity (no moving or adjustable parts) and relatively low cost. However, the machining tolerances required for parallelism, particularly in the case of large area probe cards, can be difficult to achieve. Hence, in practice, shims are often used to provide some degree of planarity tuning during assembly. Shimming, though a practical alternative, is difficult to perform accurately in a manufacturing environment to the tolerances required (on the order of microns). Also, shimming is not a practical means of adjusting planarity in the field to suit the planarity errors or offsets of a particular test cell or group of test cells.

FPCAs include U.S. Pat. No. 3,806,801 entitled "Probe Contactor Having Buckling Beam Probes." Buckling Beam assemblies have a vertical buckling beam probe head, a PCB, and an interposer situated between the probe head and the PCB. In this case the interposer comprises an array of solder balls which electrically connect the substrate to the PCB (terminal to terminal) but other examples are well known in the art where the interposer connects the substrate to the PCB by means of spring-pins or other compliant means. In another version of the Buckling Beam probe card, there is no interposer and the buckling beams connect directly to the terminals of the PCB.

Figure 8:
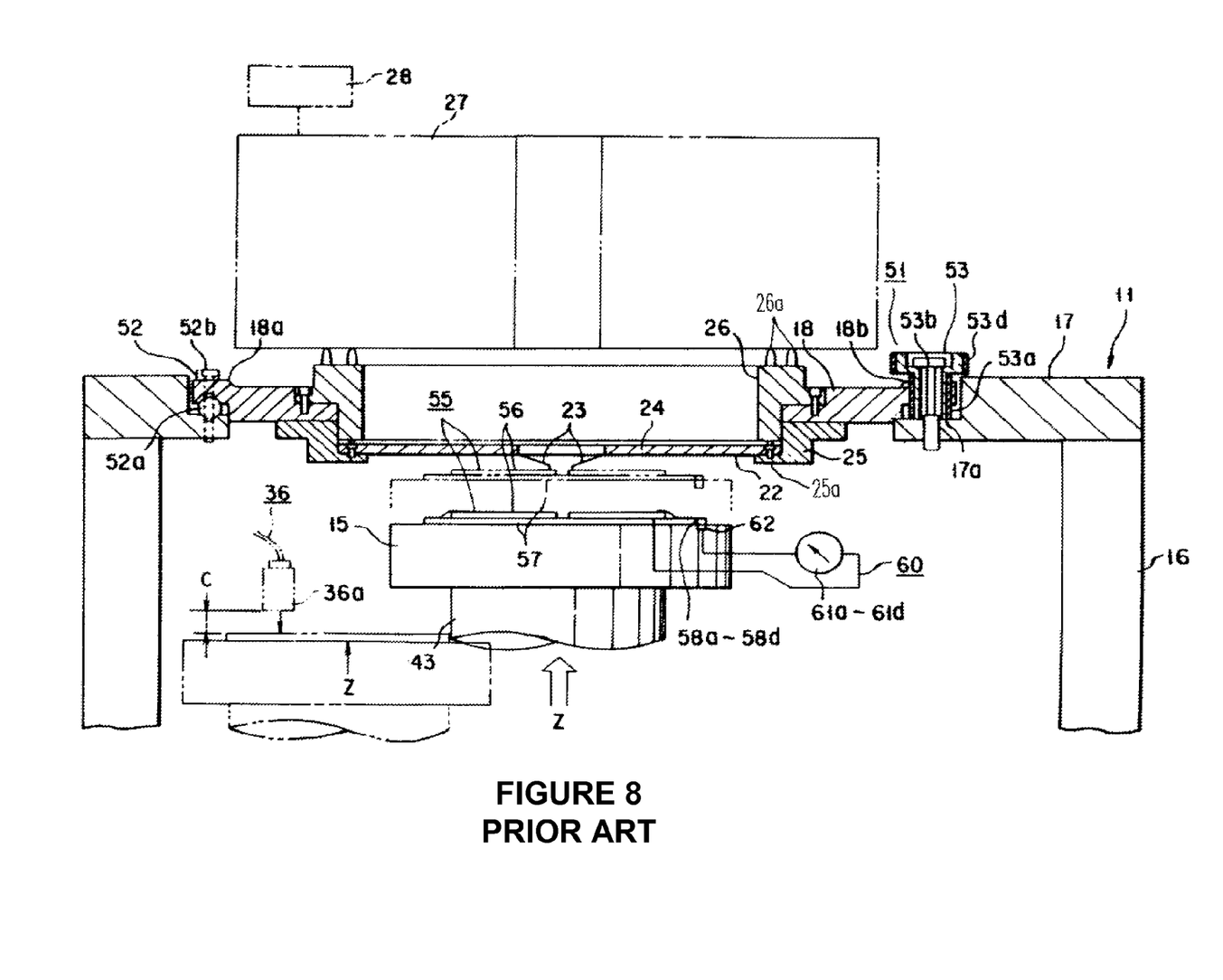
FIG. 8 is an APCA from U.S. Pat. No. 5,804,983.

APCAs allow for some adjustment. U.S. Pat. No. 5,804,983 entitled "Probe Apparatus with Tilt Correction Mechanisms" and U.S. Pat. No. 5,642,056 entitled "Probe Apparatus for Correcting the Probe Card Posture Before Testing" describe an APCA. As shown in FIG. 8, the apparatus contains a plate head 17 and an insert ring 18 (also known as a probe card mount). An adjuster is located between them at part 53. The adjuster allows an adjustment of the card body 24, and consequently the probe contactors 23. In practice, the adjuster 53 is manipulated to make the insert ring 18 and the probe chuck 15 parallel. This method is based on the often faulty assumption that the probe card's reference plane is parallel to the contactor tip plane, such that making the insert ring 18 parallel will automatically render the probe tips parallel to the probe chuck 15.

In practice, the probe testing apparatus is adjusted periodically (for example, once a year) because it requires that the apparatus be taken off line for a long period. The adjustment is generally not made with regards to a certain card, again based on the assumption that the probe card's reference plane is parallel to the contactor tips. Thus, when the probe testing apparatus is fitted with a new probe card, often the adjustments are left intact. As described above, this may result in a planarity error that is attributable to the manufacturing variance of the probe cards themselves.

Figure 9:
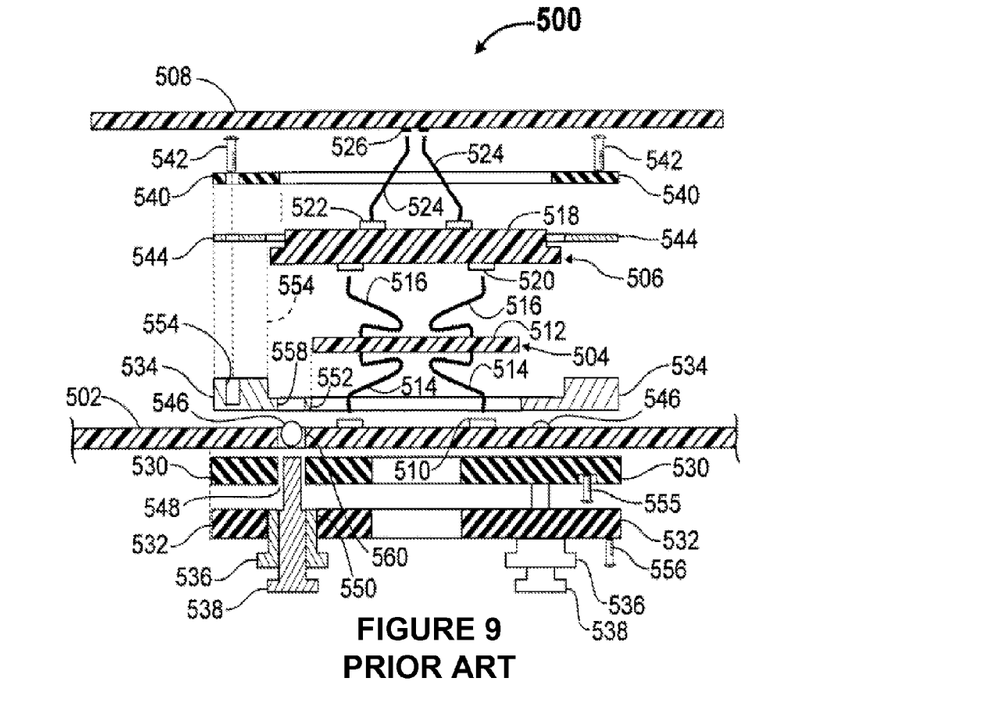
FIG. 9 is an embodiment from U.S. Pat. No. 5,974,662 that shows an interposer with vertically compliant contactors for fine tune adjustment for planarization.

Other methods to fine tune planarization have been used. For example, U.S. Pat. No. 5,974,662 entitled "Method of Planarizing Tips of Probe Elements of a Probe Card Assembly," shown in FIG. 9, describes such an APCA and discloses a method of making a probe card with an adjustment of the probe tips relative to the probe card's reference plane. The probe card incorporates a space transformer substrate which is mounted to the probe card in such a way that the orientation can be adjusted. A vertical spring interposer is used to electrically interconnect the probe contactor substrate to the PCB and differential screws bearing on the substrate provide the adjustability. This design is particularly expensive, difficult to assemble, and complex. In addition, the large number of mechanical components required to achieve adjustability make the design inherently thermally and mechanically unstable.

Figure 10:
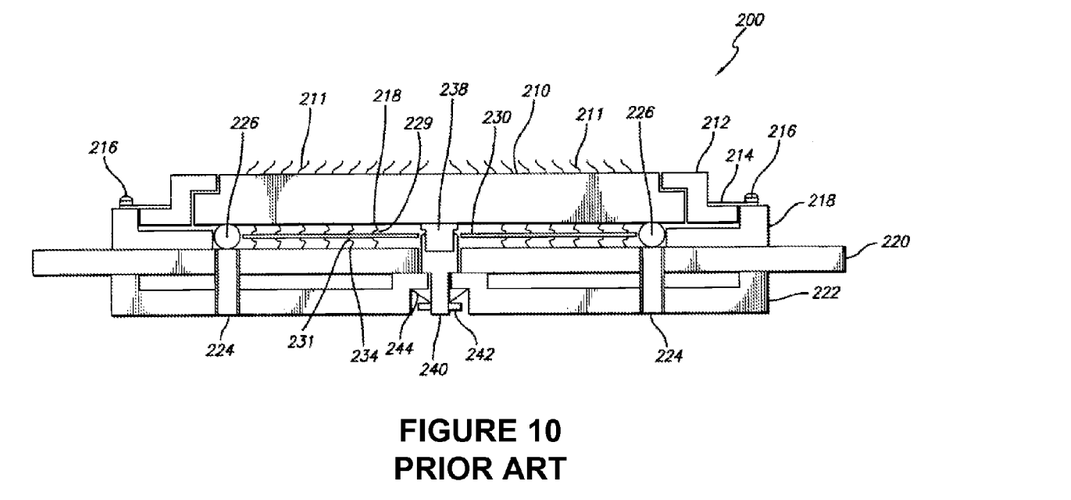
FIG. 10 is an embodiment from U.S. Pat. No. 6,609,751 that shows a stud/actuator nut complex for fine tune adjustment for planarization.

Another fine tuning method is shown in FIG. 10, which is taken from U.S. Pat. No. 6,609,751 entitled "Planarizer for a Semiconductor Contactor." The probe card substrate 210 has a stud 238 attached to it. By turning the actuating nut 242, the stud 238 can pull or push on the substrate 210. Additionally, screws 224 can exert force on the substrate 210. The mechanism can cause the substrate to bow in order to planarize the probe contactors 211. This design, however has many disadvantages. First, the design is complicated and requires that the substrate float on ball bearing and springs. Second, bowing the substrate 210 places the substrate 210 under enormous stress, and given that the substrate 210 is made of a brittle and relatively fragile ceramic, this stress can break the substrate 210—rendering the probe card completely inoperable. Third, bowing the substrate 210 also stresses the interposer 230 and can cause some of the contactors 229 from the interposer 230 to (1) misalign with their intended pads, or (2) if the bowing is severe enough, completely disengage from their intended pads. In either case, the probe card would not be in complete and accurate electrical connection with the probe head and, thus, the diagnostic equipment and would render the probe card (or at least a portion of the probe card) inoperable.

What is needed, therefore, is an improved probe card that allows for fine tuned planarization. Moreover, the probe card must be less complicated and expensive, and cannot impart undesirable stresses on the substrate or the interposer.

3. SUMMARY OF THE INVENTION

The present disclosure provides a probe card for testing a semiconductor device. The probe card is adapted to come into contact with a probe card mount, the probe card comprises a printed circuit board fastened to a stiffener and a probe head that is in electrical contact with the printed circuit board. The probe head further comprises a plurality of probe contactor tips that define a first plane. The stiffener further comprises at least two planarizing adjusters that come into contact with the probe card mount. The adjusters may be actuated to alter the position of first plane.

In one embodiment, a surface of the semiconductor device under test may define a second plane, and the adjusters may be adjusted to position the first plane to be substantially parallel to the second plane. The adjuster may also be adjusted to position the first plane to less than 10 micrometers from parallel of the second plane. Also, the adjusters may be adjusted +/−100 micrometers. The number of adjuster can be varied with one embodiment containing at least three adjusters placed about 120 degrees apart from each other.

The probe card may also include an interposer that is in electrical contact with the printed circuit board and the probe head. And the probe head may further comprise a plurality of cantilever probe contactors and/or a plurality of torsional probe contactors.

In yet another embodiment, the probe card for testing a semiconductor device includes a printed circuit board affixed to a stiffener, wherein the stiffener provides rigid support to the printed circuit board and a surface of the printed circuit board defines a first plane. The stiffener further comprises an adjustment plate, a plurality of planarizing adjusters, and a plurality of ribs, where the adjustment plate is in adjustable contact with a plurality of ribs through the planarizing adjusters. These adjusters may be actuated to alter the position of the first plane.

5. DETAILED DESCRIPTION

What is described below is a novel planarizing probe card for testing a semiconductor that is less complicated and expensive than previous devices, and does not impart undesirable stresses on the substrate or the interposer. The novel probe card allows for the quick fine tune adjustment of the probe card such that the probe contactor tips are parallel to best optimize the diagnostic testing.

Figure 1A:
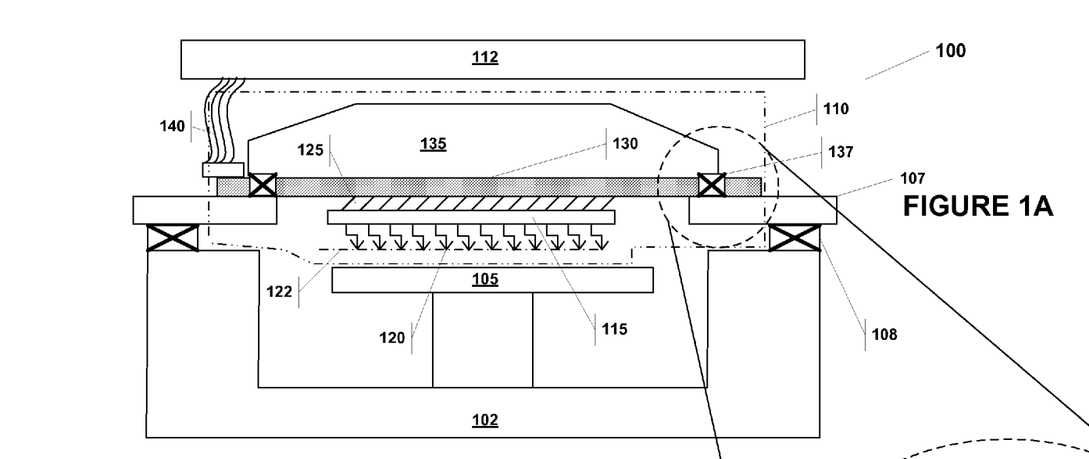
FIG. 1A illustrates an embodiment of a novel probe card with a planarizing adjuster for use in a bottom mounted probe testing apparatus.

Referring to FIG. 1A, a bottom mounted probe testing apparatus 100 with a novel planarizing probe card is presented. The probe apparatus contains a prober 102, a chuck 105, a probe card mount 107, a probe card 110 (outlined in a dashed line) and a test head 112. The probe card 110 further comprises a probe head 115 with a plurality of probe contactors 120, an interposer 125, a PCB 130 fastened to a stiffener 135 and a planarizing adjuster 137 in contact with the probe card mount 107. The probe card mount 107 may be in adjustable contact with the prober 102 through a set of adjusters 108. The probe contactors (120) may be selected from any group of contactors including, but not limited to, springs, torsional probes, cantilever probes and hybrids. The tips of the contactors define a plane 122. Between the test head 112 and the probe card 110 is an electrical connection 140; thus, the probe contactors 120 are in electrical contact with the test head 112.

Figure 1B:
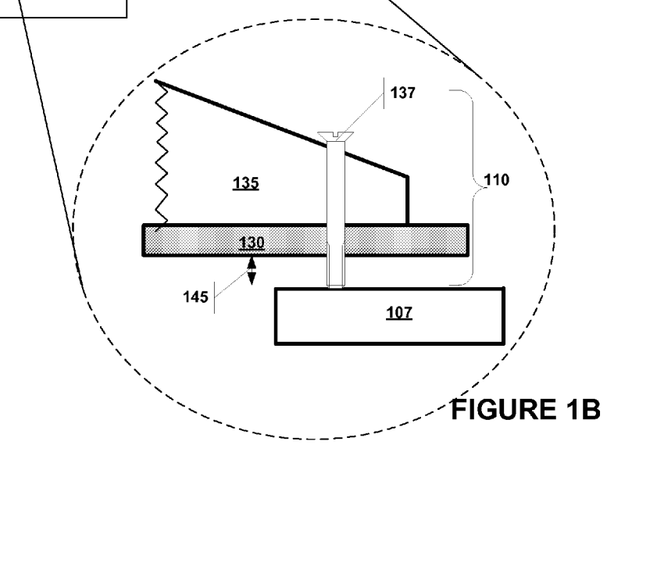
FIG. 1B presents the planarizing adjuster of FIG. 1A in greater detail.

FIG. 1B illustrates an enlarged view of the probe card's 110 interface with the probe card mount 107. The interface is realized by the planarizing adjuster 137 that can move the probe card 110 in the direction of arrow 145. It should also be noted that previous probe cards often allowed the PCB 130 to come into direct contact with the probe card mount 107. The disadvantage to this arrangement is that the PCB is made of a thermally unstable and brittle ceramic. So during testing when the devices could heat and vibrate, the planarity and stability of the probe card could suffer. In contrast, the novel probe card just described is an improvement because the adjuster 137 is made of a resilient and stable material, such as metal, and is in contact with the probe card mount 107. Thus, you have a thermally stable and rigid metal to metal contact point for the probe card 110.

Figure 1C:
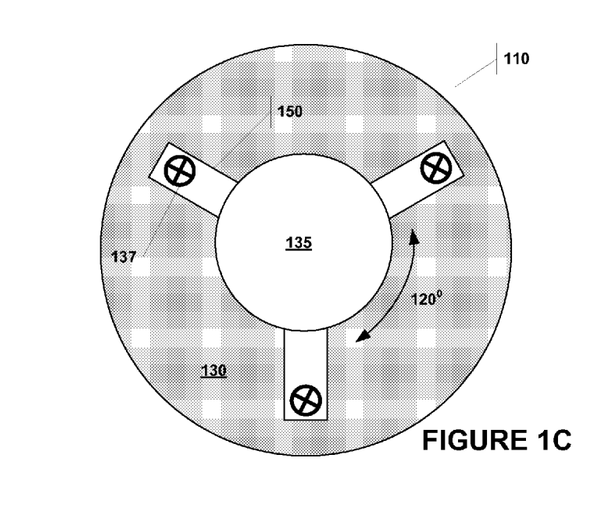
FIG. 1C is an example of the placement of the fine tune adjusters on the stiffener.

In FIG. 1C is a top view of the probe card 110. The stiffener 135 is affixed to the PCB 130 and in this embodiment contains three ribs 150. Each of these ribs 150 has a planarizing adjuster 137. In this configuration, each rib is placed about 120 degrees from each other. It would be apparent to one of skill in the art that more ribs may be used and more planarizing adjusters may be used. Also the location of the ribs and the adjusters may be manipulated to meet the design considerations of the probe card.

Figure 2A:
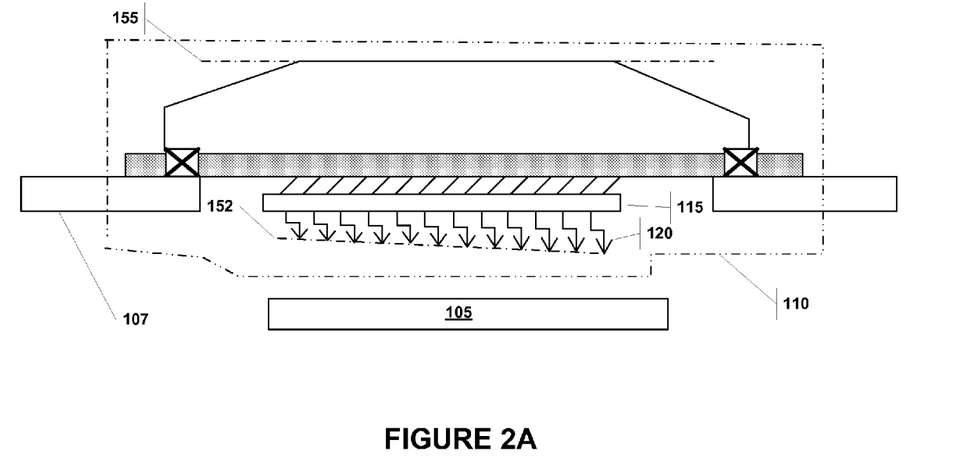
FIG. 2A illustrates a novel probe card with planarizing adjusters, wherein the contactor tips that are not properly parallel.
Figure 2B:
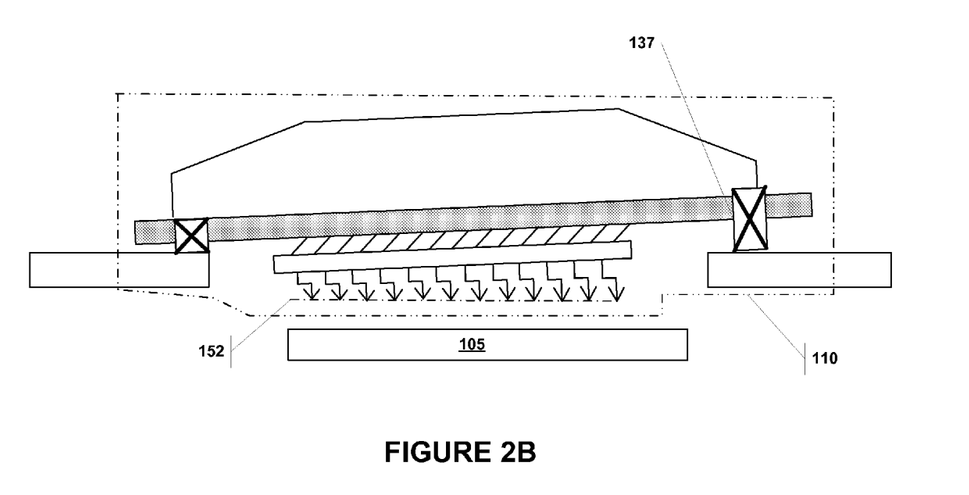
FIG. 2B illustrates a novel probe card with planarizing adjusters, wherein the adjusters have been actuated to bring the contactor tips into proper parallel.

Turning to FIG. 2A, the probe card 110 is shown with a plurality of probe contactors 120. The probe card 110 has been made parallel to the probe card mount 107, which is parallel to the probe chuck 105. However, the probe head 115 has a plurality of probe contactors 120 whose tips define a plane 152. This plane 152, however, is not parallel to the probe 105 chuck or to the probe card reference plane 155. This may occur by irregularities in probe card manufacturing. Also, the probe may become less parallel through continued use. For whatever reason, this deviance from parallel from the chuck must be corrected if the probe apparatus is to be efficient in its diagnostic testing. Under current methods, the probe card reference plane, often defined by the PCB, is indeed parallel and the probe apparatus may therefore continue operation without adjustment. In FIG. 2B the planarizing adjuster 137 is actuated such that it brings the plane defined by the contactor tips to be substantially parallel with the probe chuck 105. Depending on the probe testing apparatus and the device under test, it may be possible to bring the plane 152 to less than 20 micrometers of parallel with the probe chuck 105, more preferably less than 10 micrometers. At this point the probe apparatus may begin diagnostics testing, avoiding inefficiencies due to non-planarity.

Thus the embodiment just described recognizes that the probe card may not be in completely internally parallel. Either through manufacturing variances or operational wear, the probe contactor tips may indeed lie in a plane that is not parallel to the probe card reference plane.

Figures 3A, 3B:
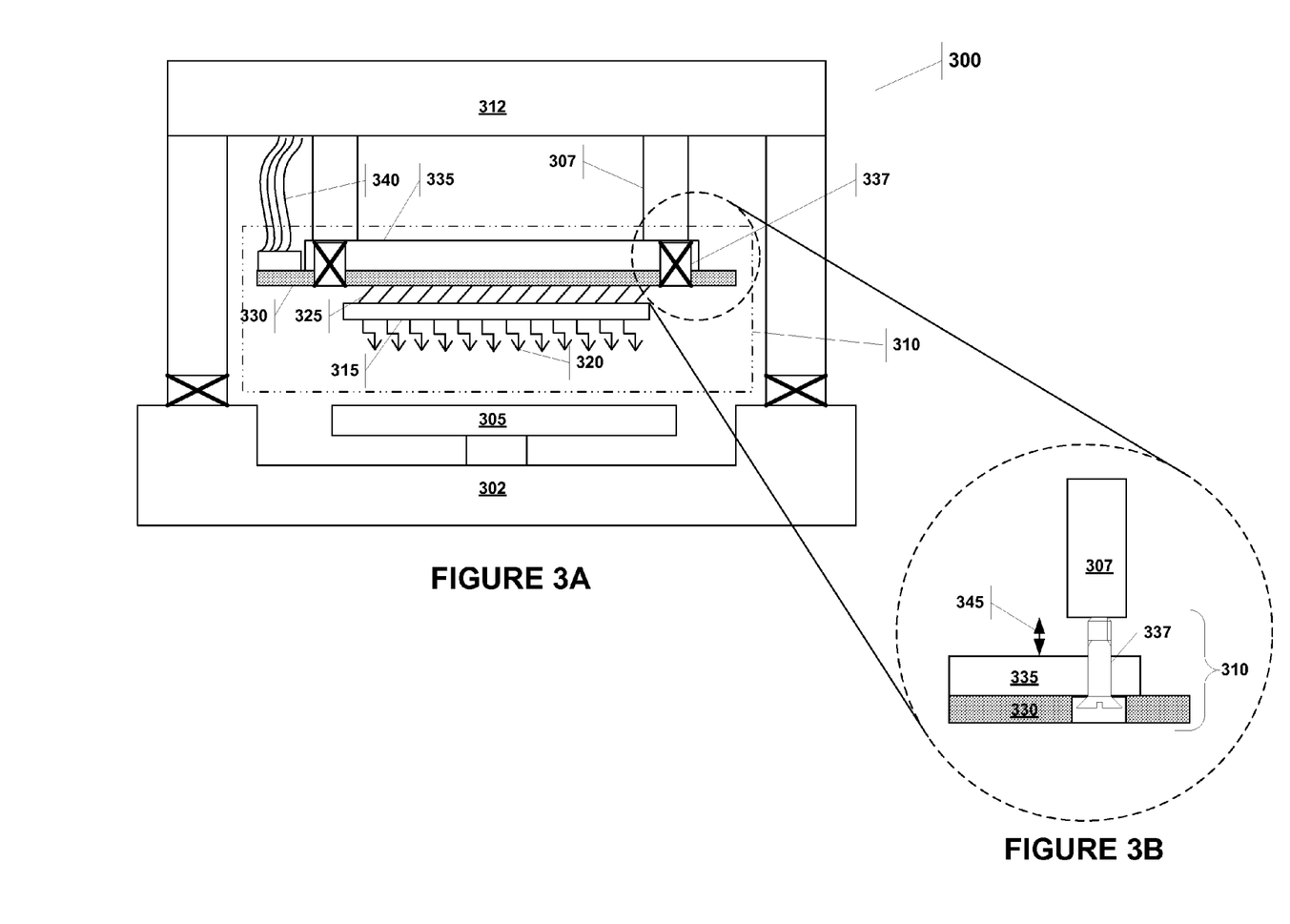
FIG. 3A illustrates an embodiment of a novel probe card with a planarizing adjuster use in a top mounted probe testing apparatus.
FIG. 3B presents the planarizing adjuster of FIG. 3A in greater detail.

Referring to FIG. 3A, a top mounted probe apparatus 300 with a novel planarizing probe card is presented. The probe apparatus contains a prober 302, a chuck 305, a probe card mount 307, a probe card 310 (outlined in a dashed line) and a test head 312. The probe card 310 further comprises a probe head 315 with a plurality of probe contactors 320, an interposer 325, a PCB 330, a stiffener 335 and a planarizing adjuster 337 in contact with the probe card mount 307. Between the test head 312 and the probe card 310 is an electrical connection 340.

FIG. 3B shows an enlarged view of the probe card's 310 interface with the probe card mount 307. The interface is realized by the planarizing adjuster 337 that can move the probe card 310 in the direction of arrow 345. Again, this embodiment has the advantage of a planarizing adjuster that is constructed of a resilient and thermally stable material, such as metal, which is in contact with the probe card mount 307. Consequently, the design has the advantage of a thermally stable and rigid metal to metal contact point for the probe card 3 10.

Figure 4A:
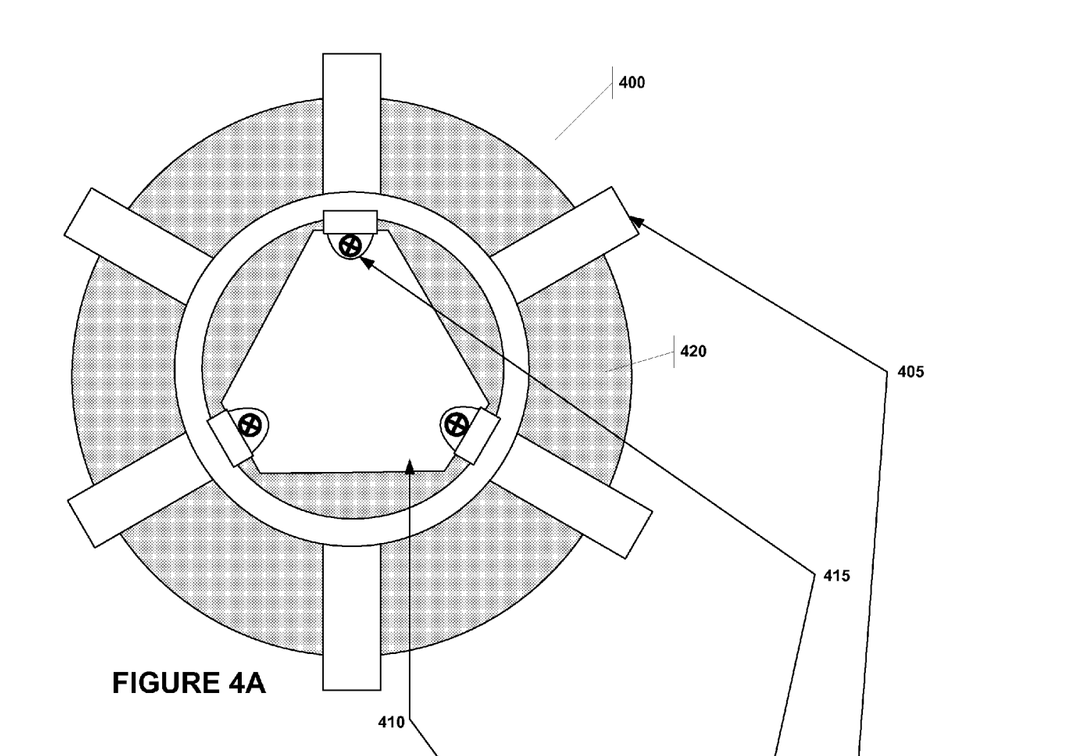
FIG. 4A is an example of a PCB and stiffener with adjusters in the central region of the stiffener.

Turning now to FIG. 4A, a novel stiffener 400 is illustrated. The stiffener is comprised of a plurality of ribs 405 that may radiate from the center of the stiffener 400. FIG. 4A illustrates six such ribs. Of course the number may vary depending on the application. At the center of the stiffener 400 is an adjustment plate 410 with a plurality of planarizing adjusters 415, which, in turn are connected to the ribs 405. The adjusters may be placed about 120 degrees from each other. Attached to the stiffener 400 is the PCB 420 (shaded) by way of a plurality of fasteners located towards the outer edge of the PCB 420 (shown as 425 in FIG. 4B). Actuating the planarizing adjusters 415, adjusts the adjustment plate 410 which imparts a force on the PCB 420; thus changing the planarity of the PCB 420. Optionally, a second set of fasteners (shown as 430 in FIG. 4B) may be used to connect the PCB 420 to the adjustment plate 410. This option would allow the adjustment plate 410 to push and pull the PCB 420 in the direction perpendicular to the plane of PCB.

Figure 4B:
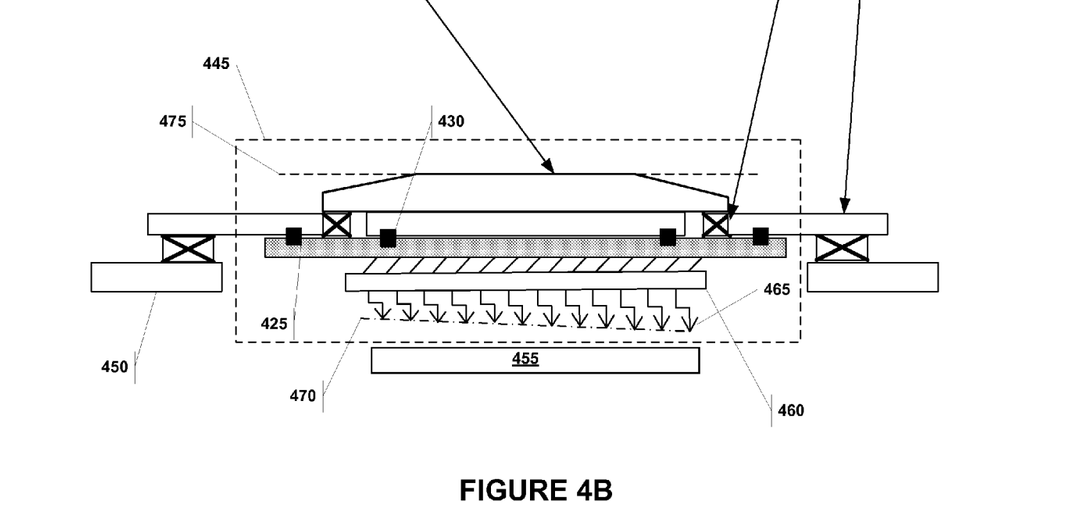
FIG. 4B illustrates the stiffener of FIG. 4A for use with a novel probe card in a bottom mounted probe testing apparatus.

FIG. 4B illustrates the stiffener 400 used in a bottom mounted probe testing apparatus. The probe card 445 (outlined by the dashed line) has been made parallel to the probe card mount 450, which is parallel to the probe chuck 455. However, the probe head 460 has a plurality of probe contactors 465 whose tips define a plane 470. This plane 470, however, is not parallel to the probe chuck 455 or to the probe card reference plane 475. This may occur by irregularities in probe card manufacturing. Also, the probe may become less parallel through continued use. For whatever reason, this deviance from parallel from the chuck must be corrected if the probe apparatus is to be efficient in its diagnostic testing. Under current methods, the probe card reference plane, defined by the PCB is indeed parallel and the probe apparatus may therefore continue operation without adjustment.

Figure 4C:
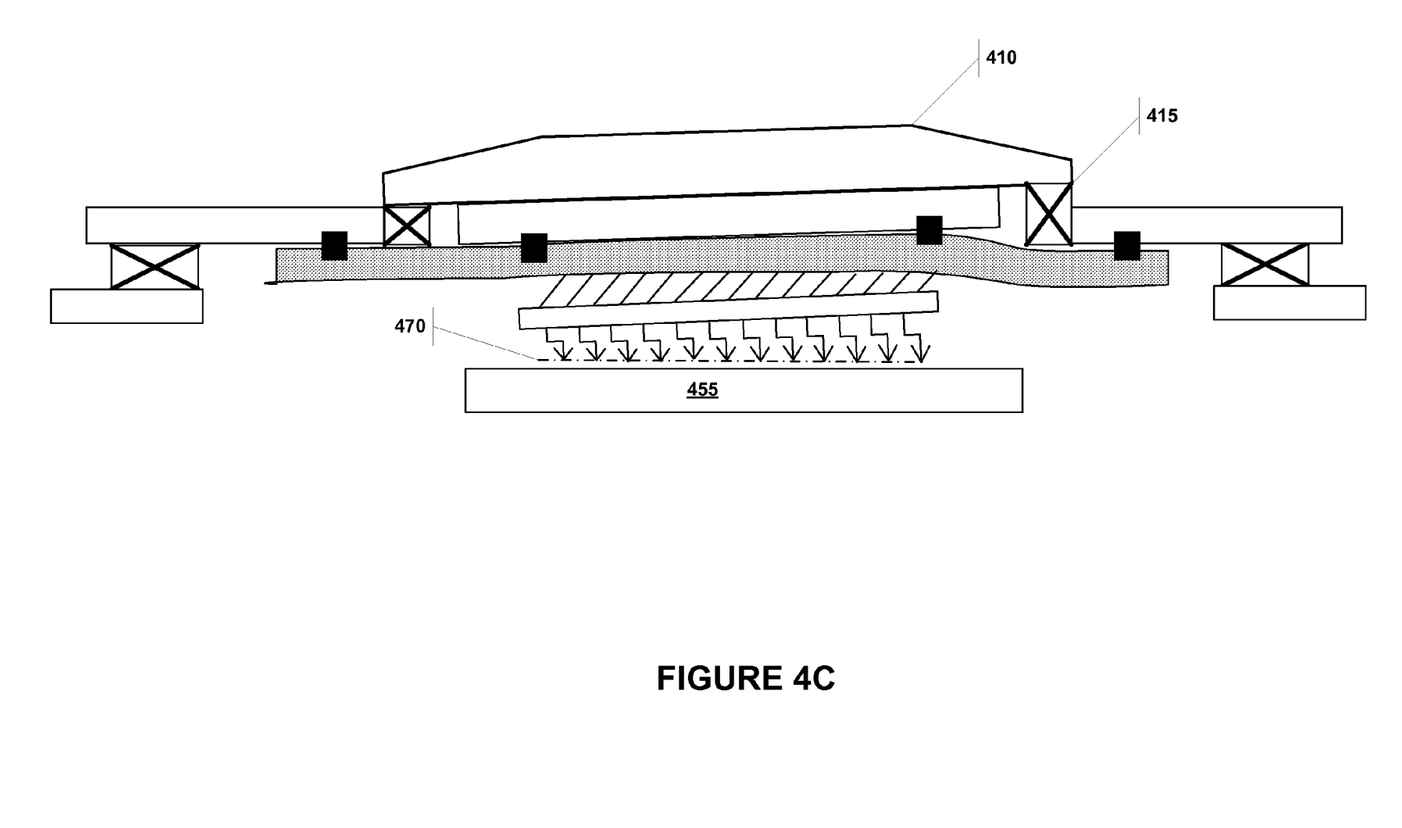
FIG. 4C illustrates a novel probe card with planarizing adjusters, wherein the adjusters have been actuated to bring the contactor tips into proper parallel.

In FIG. 4C, the planarizing adjuster 415 is actuated such that it changes the planarity of the adjustment plate 410. This adjustment changes the planarity of the PCB and brings the plane defined by the contactor tips to be substantially parallel with the probe chuck 455. Depending on the probe testing apparatus and the device under test, it may be possible to bring the plane 470 to less than 20 micrometers of parallel with the probe chuck 455, more preferably less than 10 micrometers. At this point the probe apparatus may begin diagnostics testing, avoiding inefficiencies due to non-planarity. The level of PCB deformation shown in FIG. 4C is exaggerated for illustration; in practice the deformation would be small enough so as to not comprise the structural integrity of the PCB.

Figure 4D:
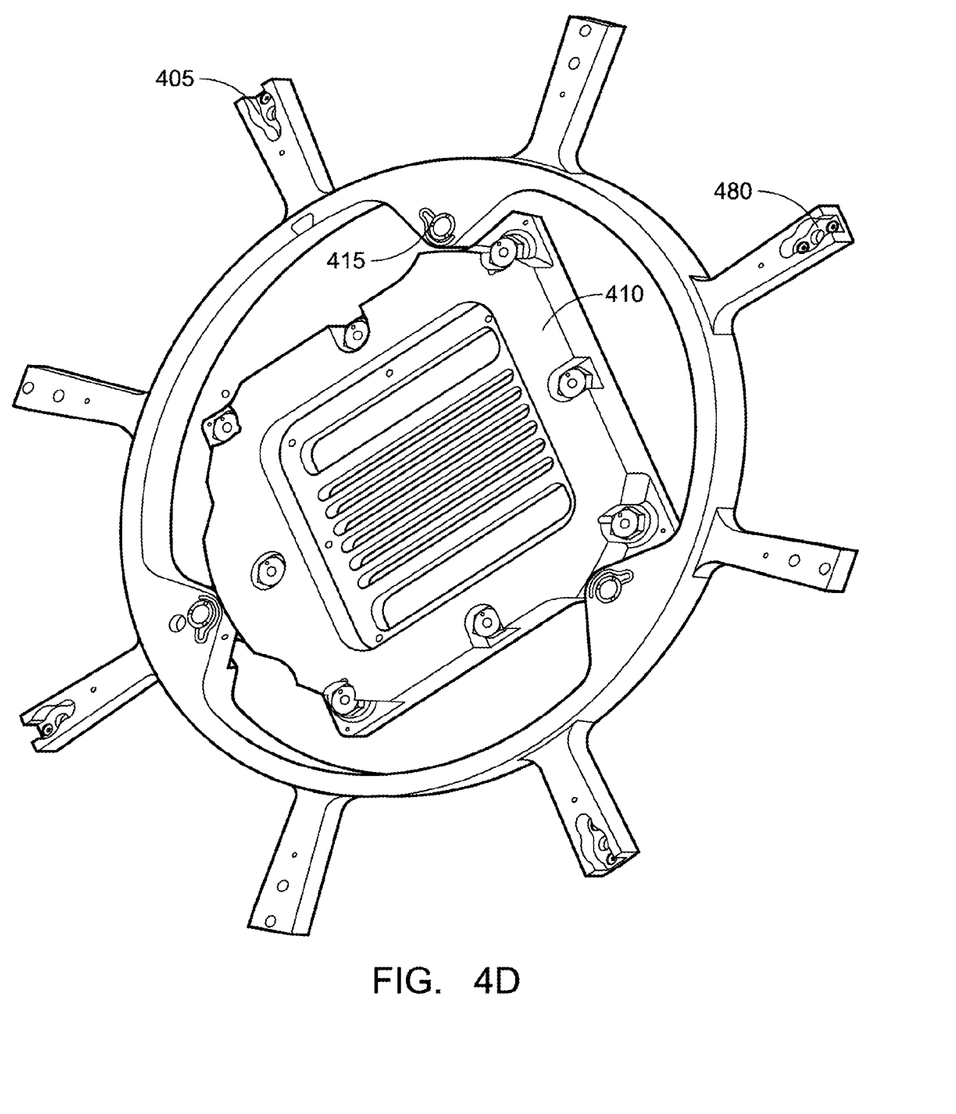
FIG. 4D is a computer rendering of a novel PCB stiffener with adjusters in the central region of the stiffener.

FIG. 4D is a computer rendering of the novel PCB stiffener with an adjustment plate 410 in the central region of the stiffener. This embodiment contains three planarizing adjusters 415 spaced about 120 degrees from each other. This embodiment includes eight ribs 405. These ribs 405 have holes 480 adapted to receive a fastener that would affix the PCB (not shown) to the stiffener.

Figure 5:
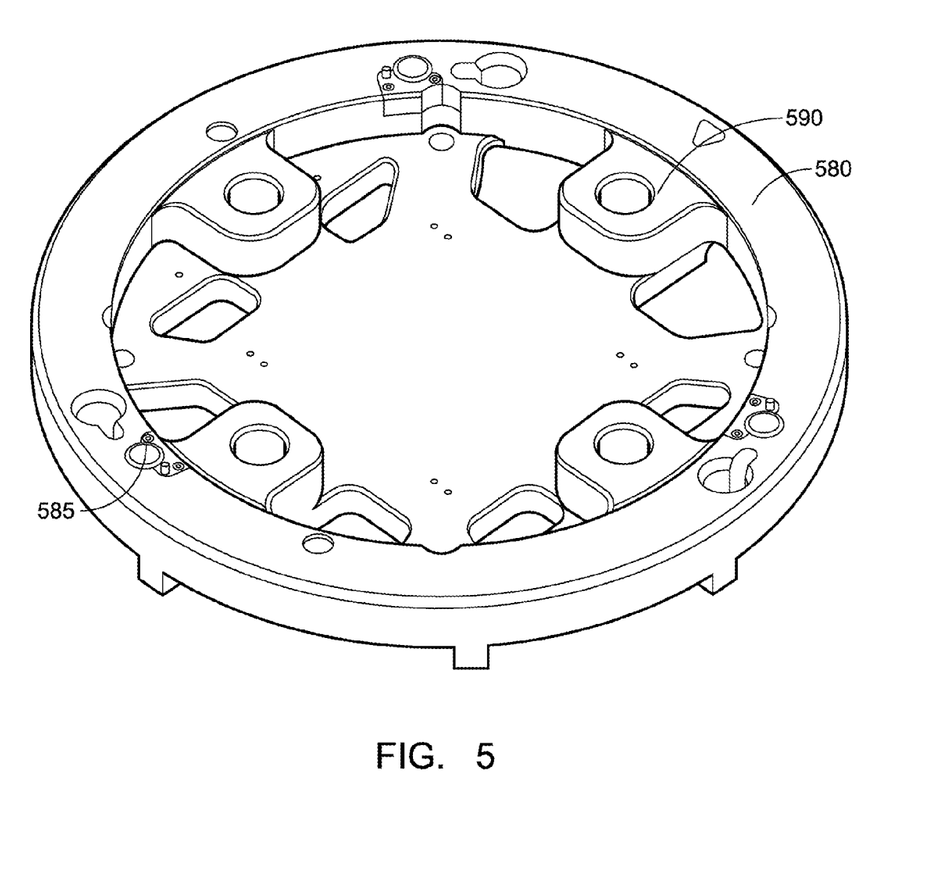
FIG. 5 is a computer rendering of a novel stiffener with three planarizing adjusters.

FIG. 5 is a computer rendering of a stiffener 580 with three planarizing adjusters 585 for contact with the probe card mount (e.g. part 107 in FIG. 1A). Each of the planarizing adjusters are placed about 120 degrees apart from each other, which allows for complete planar adjustment of the PCB. The PCB (not shown) is fastened onto the stiffener 580 on the four orthogonally placed pads 590. An interposer (not shown) is in electrical connection with the PCB, and a probe head (also not shown) is in electrical connection with the interposer. The probe head will comprise a plurality of probe contactors (not shown), and the tips of those contactors will lie substantially in a plane. Thus adjustment of the stiffener 580 by the planarizing adjusters will adjust the entire probe card including the plane defined by the probe contactor tips. This was shown with reference to FIGS. 2A and 2B.

Figures 6A, 6B, 6C:
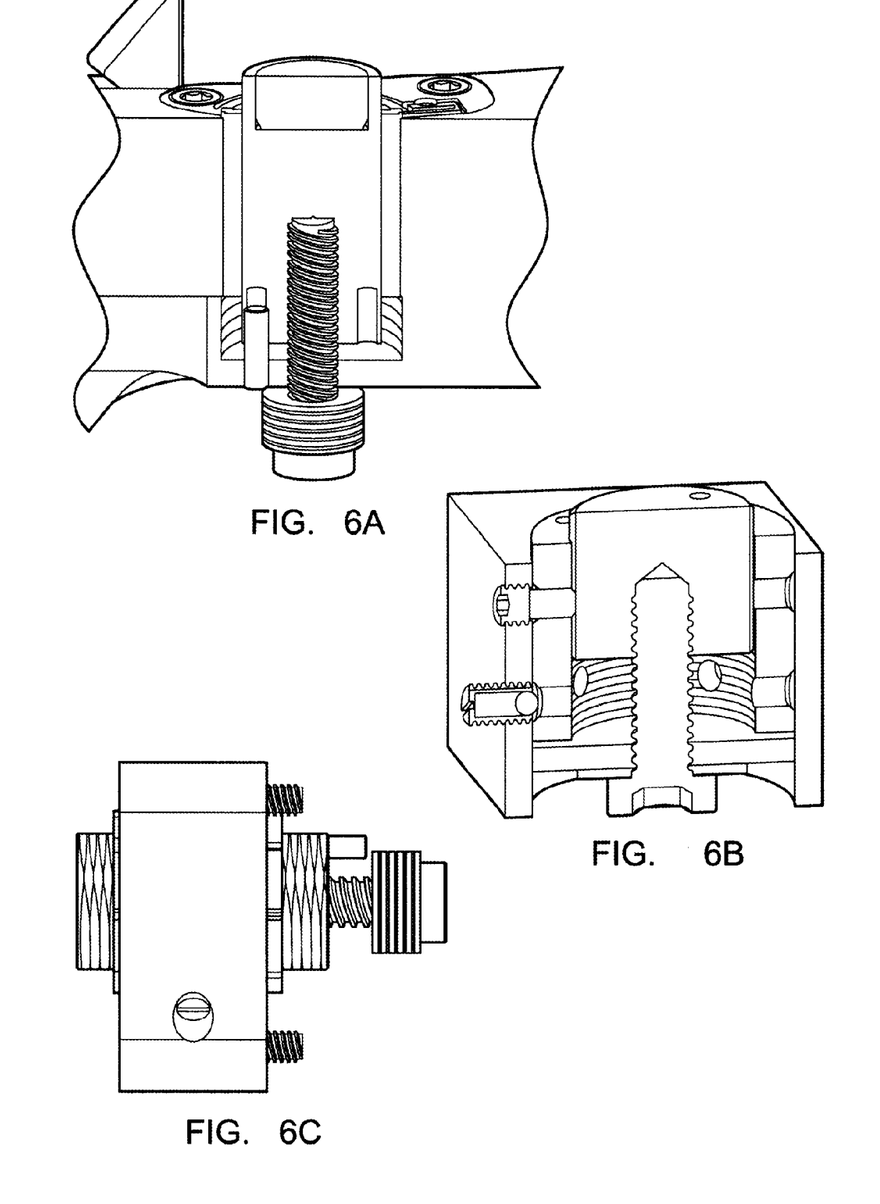
FIGS. 6A-6C are computer renderings of examples of the possible structures for the planarizing adjusters.

Shown in FIG. 6A is computer rendering of a preferred embodiment of the planarizing adjusters that extend through the stiffener 580 (see FIG. 5). In this configuration, the planarizing adjusters are easily accessible by the technician operating the device. The adjuster may also be actuated with a hand tool, such that a technician can quickly adjust the planarizing adjuster. This adjustment would not only reduce the problems associated with non-planarity, but would do so quickly resulting in little down time of the probe apparatus, increasing the yield of the diagnostic process.

FIGS. 6B and 6C present other examples of the planarizing adjusters. These are a few of the examples that could be used to realize the novel probe card described herein. The adjusters should preferably be locking such that they do not back out and lose the adjustment. Also, the adjusters should have an ample range to address the non-planarity of the probe contactor tips. This may include a range of +/−100 micrometers, but this range would of course depend on the design requirements of the probe card and the probe testing apparatus. Once such requirement may be the electrical connection between the test head and the probe card. If the planarizing adjusters may be adjusted to severely, then this electrical connection may not be possible.

In previous methods of planarization, the probe card reference plane was planarized to the chuck. This adjustment is performed on a yearly basis to probe apparatus, irrespective of the probe card used or the device under test. As described above, the probe card themselves may have manufacturing variances that cause the contactor tips to lie in a plane that is not parallel to the chuck. The probe apparatus may be able to accommodate a small deviance from parallel, but at large deviations several problems exists: (1) the contactor tips may not make electrical contact with their intended pads; (2) some probe contactors may be flexed beyond allowable specification, promoting a localized failure of those contactors; and (3) some contactors may not have a sufficient force against the intended pad such that its electrical interface is not optimal, causing false negatives in testing. The advantage to the foregoing embodiments over the prior art is that the reference plane of the contactor tips can be adjusted to whatever device it is testing without regard to the probe chuck. So if the contactor tips lie in a plane that is not parallel to the chuck (or the device under test), the probe can be easily fine adjusted to achieve the required parallelism.

Another advantage is that the entire probe card is adjusted together as a unit. So unlike the complicated vertical interposers of the prior art that allowed the PCB and the probe contactor tips to have different planes, the present embodiments adjusts the entire probe card (including the PCB and the contactor tips) so no intricate interposers need to be implemented.

Also, the prior art method of bowing the substrate has several drawbacks already discussed including damage to the probe card substrate and interposer. Here, the embodiments do not impart additional stresses to the probe head. In addition, the entire probe card is treated as a unit so the interposer should not experience dislodgement from its intended pads caused by an adjustment of the planarizing adjusters.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein. Moreover, the applicants expressly do not intend that the following claims "and the embodiments in the specification to be strictly coextensive." Phillips v. AHW Corp., 415 F.3d 1303, 1323 (Fed. Cir. 2005) (en banc).

The invention claimed is:

1. A probe testing apparatus comprising:
   a prober;
   a test head;
   a probe card mount, wherein the probe card mount is attached to the test head, the test head and the probe card mount are in adjustable contact with a prober through a first set of planarizing adjusters;
   a probe card for testing a semiconductor device, the probe card is in adjustable contact with a probe card mount, the probe card comprising:
     a printed circuit board affixed to a stiffener, wherein the stiffener provides rigid support to the printed circuit board;
     a probe head that is in electrical contact with the printed circuit board, the probe head further comprising a plurality of probe contactor tips, the plurality of probe contactor tips defining a first plane; and
     the stiffener further comprising a second set of planarizing adjusters that come into contact with the probe card mount and wherein the first and second set of adjusters may be actuated to alter the position of first plane.

2. The probe testing apparatus of claim 1, wherein a surface of the semiconductor device defines a second plane, and the first and second set of adjusters position the first plane to be substantially parallel to the second plane.

3. The probe testing apparatus of claim 1, wherein the semiconductor device lies on a probe chuck, and a surface of the probe chuck defines a second plane, and the first and second set of adjusters position the first plane to be substantially parallel to the second plane.

4. The probe testing apparatus of claim 1, wherein a surface of the semiconductor device defines a second plane, and the first and second set of adjusters position the first plane to less than 10 micrometers from parallel of the second plane.

5. The probe testing apparatus of claim 1, wherein each adjusters may be adjusted +/−100 micrometers.

6. The probe testing apparatus of claim 1, wherein the second set of adjusters comprises at least three adjusters spaced at about 120 degrees apart from each other.

7. The probe testing apparatus of claim 1 further comprising an interposer that is in electrical contact with the printed circuit board and the probe head.

8. The probe testing apparatus of claim 1 wherein the probe head further comprises a plurality of cantilever probe contactors.

9. The probe testing apparatus of claim 1 wherein the probe head further comprises a plurality of torsional probe contactors.

10. A probe testing apparatus comprising:
a prober;
a probe card mount, wherein the probe card mount is in adjustable contact with a prober through a first set of planarizing adjusters;
a probe card for testing a semiconductor device, the probe card is in adjustable contact with a probe card mount, the probe card comprising:
 a stiffener comprising a first stiffener part and a second stiffener part;
 a printed circuit board affixed to the first stiffener part and the second stiffener part, wherein the stiffener provides rigid support to the printed circuit board; and
 a second set of planarizing adjusters that may be actuated to alter the position of the first stiffener part relative to the second stiffener part, thereby deflecting the printed circuit board;
a probe head that is in electrical contact with the printed circuit board, the probe head further comprising a plurality of probe contactor tips, the plurality of probe contactor tips defining a first plane;
the stiffener further comprising a third set of planarizing adjusters that come into contact with the probe card mount;
wherein the first, second and third set of planarizing adjusters may be actuated to alter the position of first plane.

* * * * *